United States Patent
Takabayashi et al.

(10) Patent No.: US 9,711,938 B2
(45) Date of Patent: Jul. 18, 2017

(54) INTEGRATED SEMICONDUCTOR OPTICAL ELEMENT AND MANUFACTURING METHOD FOR SAME

(71) Applicant: FUJITSU LIMITED, Kawasaski-shi, Kanagawa (JP)

(72) Inventors: Kazumasa Takabayashi, Atsugi (JP); Tsuyoshi Yamamoto, Zama (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/947,067

(22) Filed: Nov. 20, 2015

(65) Prior Publication Data
US 2016/0079727 A1  Mar. 17, 2016

Related U.S. Application Data

(63) Continuation of application No. PCT/JP2013/064321, filed on May 23, 2013.

(51) Int. Cl.
*H01S 5/026* (2006.01)
*G02F 1/017* (2006.01)
(Continued)

(52) U.S. Cl.
CPC .............. *H01S 5/026* (2013.01); *G02B 6/122* (2013.01); *G02B 6/131* (2013.01); *G02F 1/017* (2013.01); *G02F 1/025* (2013.01); *H01S 5/0265* (2013.01); *H01S 5/101* (2013.01); *H01S 5/12* (2013.01); *H01S 5/2213* (2013.01); *G02F 2001/212* (2013.01); *H01S 5/2275* (2013.01); *H01S 5/40* (2013.01)

(58) Field of Classification Search
CPC . H01S 5/026; H01S 5/12; H01S 5/101; H01S 5/0265; H01S 5/2213; H01S 5/2275; G02B 6/131
See application file for complete search history.

(56) References Cited

U.S. PATENT DOCUMENTS

| | | |
|---|---|---|
| 2004/0016920 A1 | 1/2004 | Akiyama et al. |
| 2005/0254743 A1 | 11/2005 | Akiyama et al. |
| 2008/0291952 A1 | 11/2008 | Yamamoto et al. |

FOREIGN PATENT DOCUMENTS

| | | | |
|---|---|---|---|
| JP | 06152068 | * | 5/1994 |
| JP | 09101491 | * | 4/1997 |

(Continued)

OTHER PUBLICATIONS

International Search Report, mailed in connection with PCT/JP2013/064321 and mailed Jun. 25, 2013 (2 pages).

*Primary Examiner* — Dung Nguyen
(74) *Attorney, Agent, or Firm* — Fujitsu Patent Center

(57) ABSTRACT

The present invention relates to an optical semiconductor integrated element and manufacturing method for same solves difficulty in element manufacture, and reduces optical transmission loss. The present invention is provided with a stripe-shaped waveguide configured from a multilayer structure wherein at least a first conductivity-type lower cladding layer, a waveguide core layer, and an upper cladding layer are layered, and the upper cladding layer is formed using a second conductivity-type upper cladding layer, and an i-type upper cladding layer, which has a bent portion by being shifted in the perpendicular direction with respect to the main extending direction of the waveguide.

11 Claims, 15 Drawing Sheets

(51) Int. Cl.
  *G02F 1/025* (2006.01)
  *G02B 6/122* (2006.01)
  *H01S 5/10* (2006.01)
  *H01S 5/12* (2006.01)
  *H01S 5/22* (2006.01)
  *G02B 6/13* (2006.01)
  *H01S 5/227* (2006.01)
  *H01S 5/40* (2006.01)
  *G02F 1/21* (2006.01)

(56) References Cited

FOREIGN PATENT DOCUMENTS

| | | |
|---|---|---|
| JP | 10-111424 | 4/1998 |
| JP | 11-103126 | 4/1999 |
| JP | 11-183742 | 7/1999 |
| JP | 2002-164615 | 6/2002 |
| JP | 2004-053830 | 2/2004 |
| JP | 2006-065085 | 3/2006 |
| JP | 2008-294124 | 12/2008 |
| JP | 2009-205154 | 9/2009 |

\* cited by examiner

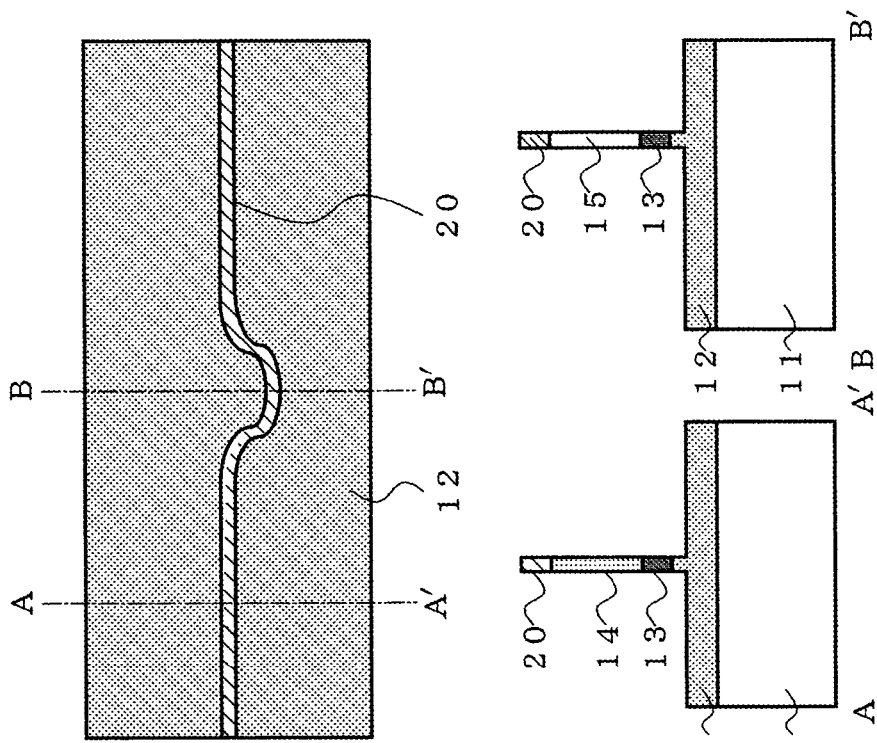
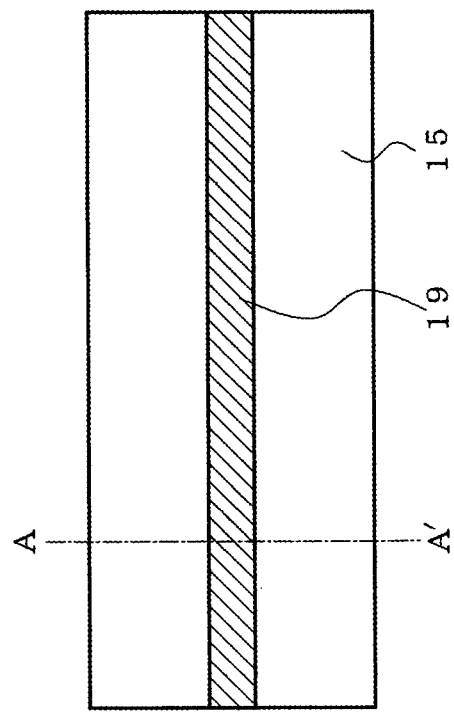

FIG. 8A
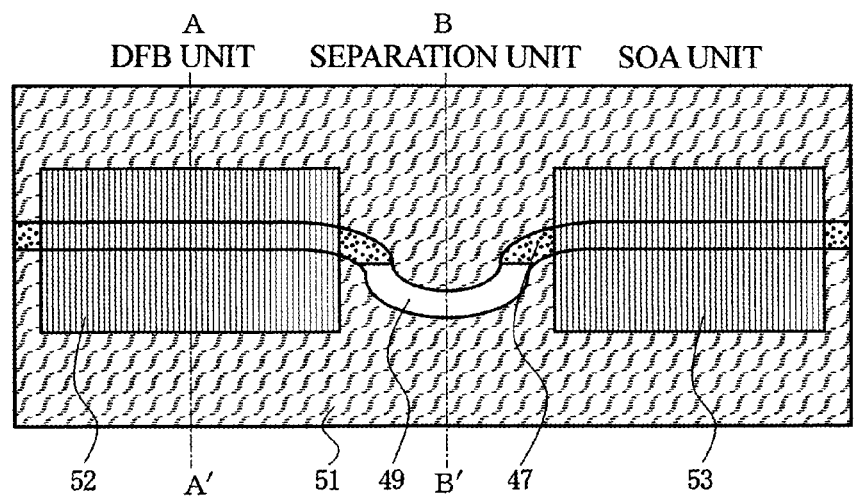
FIG. 8B
FIG. 8C
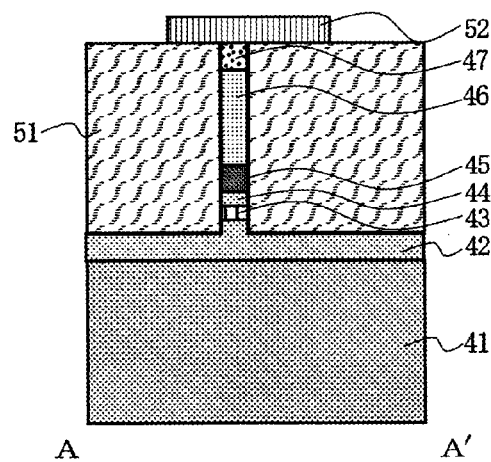
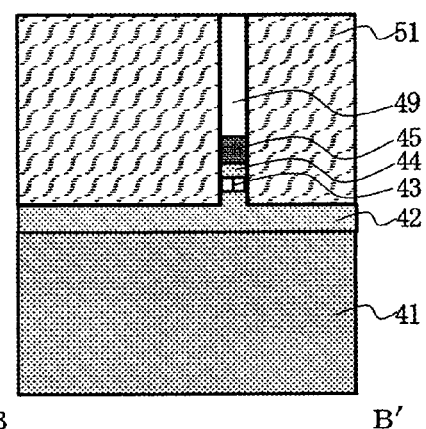

FIG. 9A
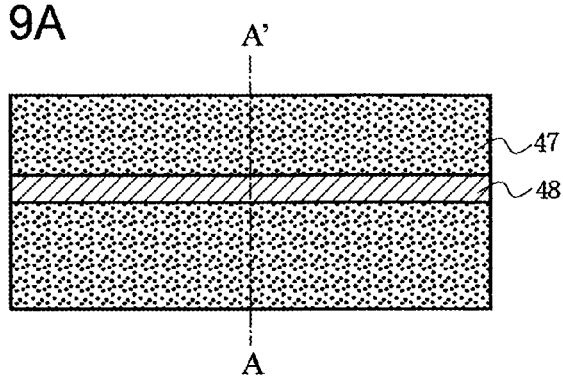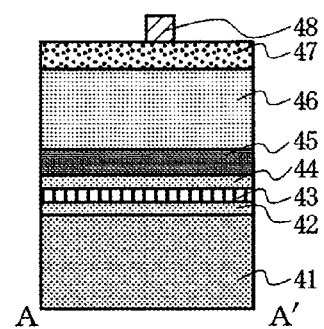
FIG. 9B
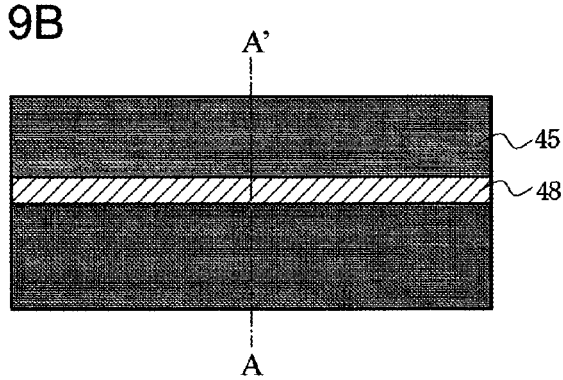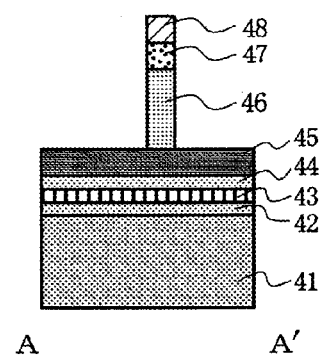
FIG. 9C
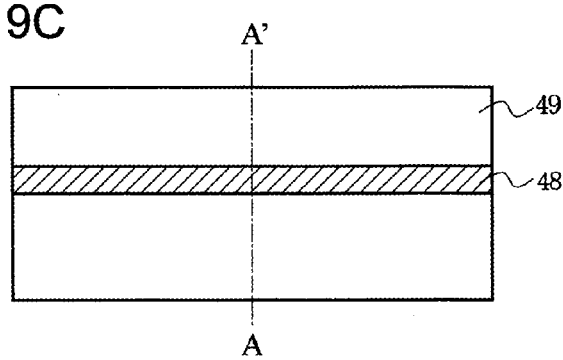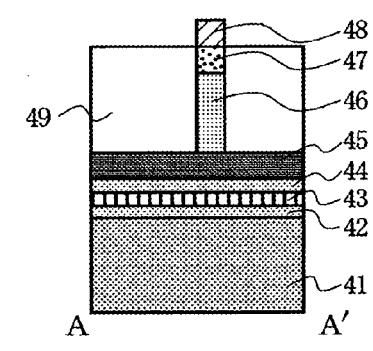

INTEGRATED SEMICONDUCTOR OPTICAL ELEMENT AND MANUFACTURING METHOD FOR SAME

CROSS-REFERENCE TO RELATED APPLICATION

This application is a continuation application of International Application PCT/JP2013/064321 filed on May 23, 2013 and designated the U.S., the entire contents of which are incorporated herein by reference.

FIELD

The present invention relates to an integrated semiconductor optical element and a manufacturing method for the same, and in particular, to an integrated semiconductor optical element where a number of functional units are monolithically integrated in one chip in such a manner that electrical isolation between these functional units is easy as well as a manufacturing method for the same.

BACKGROUND

The current optical communication systems are high level and complicated systems, such as wavelength multiplexing (WDM) communication using dual polarization quadrature phase shift keying (DP-QPSK) phase-modulated signals, in order to deal with an increase in the transmission capacity. Therefore, high-performance semiconductor optical elements are required.

One of the most effective means for realizing semiconductor optical elements with advanced performance is a monolithic integration that is forming a number of semiconductor optical elements in one chip. For example, modulator integrated semiconductor lasers are known where a semiconductor laser and an electro-absorption semiconductor optical modulator (EA modulator) of a compound semiconductor material are integrated (see Patent Document 1). SOA integrated semiconductor lasers are also known where a semiconductor laser and a semiconductor optical amplifier (SOA) are combined (see Patent Document 2). These integrated semiconductor optical elements have a number of functions such as laser oscillation and optical modulation or laser oscillation and optical amplification in one chip, and therefore, it is possible to implement a compact semiconductor optical element with advanced performance.

In addition, Mach-Zehnder (MZ) type modulators have been proposed as modulators using a compound semiconductor, and capacitor-loaded MZ modulators have been proposed as MZ modulators with particularly advanced performance (see Patent Document 3). In capacitor-loaded MZ modulators, an electrode is formed so as to be divided into portions along a waveguide, and it is possible to adjust the impedance by varying the ratio of the electrode portions. Thus, an element structure matched to 50Ω can be easily implemented, which makes it possible to obtain high radiofrequency properties.

In order to realize a stable operation in such integrated semiconductor optical elements, it is necessary for the divided electrodes to be sufficiently isolated electrically. In order to do so, such a structure of a capacitor-loaded MZ modulator has been proposed where the clad layer on top of the waveguide is a p type InP layer directly beneath the electrode portions and is an i type InP layer in the isolation portions between the electrode portions. In this structure, the clad layer between the portions of the electrode formed so as to be divided along the waveguide is an i type semiconductor layer having high resistance, which prevents leakage between the electrode portions through the clad layer, and therefore, a stable operation becomes possible.

In accordance with a general technique that is used in order to make some portions of the clad layer on top of the core layer of the above-described waveguide a p type InP layer and the other portions an i type InP layer, a p type InP clad layer is grown once on the entire surface, and after that, some portions are removed, and then, an i type InP layer is regrown in these portions. In this method, it is easy to control the doping of impurities into both the p type InP layer and the i type InP layer, which makes it possible to form the clad layer that is strictly divided into i type and p type portions.

Here, a conventional capacitor-loaded MZ type modulator is described in reference to FIGS. 12A and 12B. FIGS. 12A and 12B illustrate a conventional capacitor-loaded MZ type modulator, where FIG. 12A is a plan diagram and FIG. 12B is a cross-sectional diagram along the waveguide. As illustrated in FIG. 12A, the waveguide is provided with two waveguide arms between an input waveguide 75 and an output waveguide 76 so that light 77 that has been inputted is branched into the two waveguide arms. As illustrated in FIG. 12B, the waveguide has such a structure where an n type InP clad layer 62 and an InGaAsP core layer 63 are provided on top of a semi-insulating InP substrate 61, and on top of that, i type InP clad layer portions 67 and p type InP clad layer portions 64 are provided so as to alternate in the layer. Here, a p type InGaAsP contact layer 65 is provided on top of the p type InP clad layer portions 64 if necessary.

The space between the waveguide arms that have been etched in stripe form is filled in with an embedded insulating layer 69. An electrode on top of the waveguide 72 is selectively provided on the p type InGaAsP contact layer 65, and the portions of the electrode on top of the waveguide 72 are brought together for each waveguide arm so as to be connected to a wide electrode 70 and 71 respectively. A high frequency signal source 73 is connected between the wide electrode 70 and the wide electrode 71 on the input side, and a terminal resistor 74 of 50Ω is connected between the wide electrode 70 and the wide electrode 71 on the output side.

The light signal that has entered through the input waveguide 75 is branched into the two waveguide arms that form a modulation waveguide, modulated by a high frequency signal 78 that has been applied by a high frequency signal source 73, and is outputted from the output waveguide 76 as modulated light 79.

CITATION LIST

Patent Literature

Patent Document 1: Japanese Laid-open Patent Publication No. 2002-164615
Patent Document 2: Japanese Laid-open Patent Publication No. 2008-294124
Patent Document 3: Japanese Laid-open Patent Publication No. 2004-053830

In order to form the structure in FIGS. 12A and 12B as described above, it is necessary to grow a p type InP layer on the entire surface, and after that remove some portions of the layer, and then deposit an i type InP layer in these portions; however, such a problem arises that uneven distribution occurs in the film thickness of the clad layer. When uneven distribution occurs in the film thickness of the clad layer, not only does optical loss increase, but also the difficulty in the manufacture of the element increases, and the details of these problems are described in reference to FIGS. 13A to 15C.

FIGS. 13A to 15C are diagrams illustrating the manufacturing process for a conventional capacitor-loaded MZ type modulator. FIGS. 13A to 13C include plan diagrams on the left side and cross-sectional diagrams on the right side along the single dotted chain line A-A' in the plan diagrams on the left side. In addition, FIGS. 14A and 15A are plan diagrams, and FIGS. 14B and 15B are cross-sectional diagrams along the single-dotted chain line A-A' in the corresponding plan diagrams. Furthermore, FIGS. 14C and 15C include cross-sectional diagrams on the left side along the single-dotted chain line B-B' in the corresponding plan diagrams, and cross-sectional diagrams on the right side along the single-dotted chain line C-C' in the corresponding plan diagrams.

As illustrated in FIG. 13A, an n type InP clad layer 62, an InGaAsP core layer 63, a p type InP clad layer 64 and a p type InGaAsP contact layer 65 are grown sequentially on top of a semi-insulating InP substrate 61. Next, an $SiO_2$ mask 66 having a width for providing electrodes on top of a waveguide (72) is provided. Here, the two portions of the $SiO_2$ mask 66 are illustrated for the purpose of simple illustration, and the width of these portions of the $SiO_2$ mask 66 is approximately several hundred μm.

Next, as illustrated in FIG. 13B, the p type InGaAsP contact layer 65 and the p type InP clad layer 64 are selectively etched using the $SiO_2$ mask 66 as an etching mask. Then, as illustrated in FIG. 13C, i type InP clad layer portions 67 are regrown using the $SiO_2$ mask 66 as a selective growth mask.

Next, as illustrated in FIGS. 14A to 14C, the $SiO_2$ mask 66 is removed, and then, an $SiO_2$ film is grown again, and after that, the $SiO_2$ film is etched so as to have a waveguide pattern for forming an MZ modulator, and thus, an $SiO_2$ mask 68 is formed. Subsequently, as illustrated in FIGS. 15A to 15C, deep etching is carried out using the $SiO_2$ mask 68 as an etching mask until the a part of n type InP clad layer 62 is removed so that a waveguide pattern is formed where i type InP clad layer portions 67 and p type InP clad layer portions 64 alternate and are connected to each other in the waveguide pattern. After that, as illustrated in FIGS. 12A and 12B, the spaces in the waveguide pattern are filled in with an embedded insulating layer 69, and electrodes on top of the waveguide 72 are formed on the p type InGaAsP contact layer 65 above the p type InP clad layer portions 64.

As illustrated in FIG. 13C, however, such a problem arises that the i type InP clad layer portions 67 are thick in close proximity to the $SiO_2$ mask 66 during the process for regrowing the i type InP clad layer portions 67, that is to say, along the interface with the p type InP clad layer portions 64, and are thin in the places that are away from the interface. This is caused by the selective growth effects where the semiconductor material that has been supplied onto the $SiO_2$ mask 66 does not deposit on the $SiO_2$ mask 66, but instead moves to the vicinity of the edge of the $SiO_2$ mask 66 as a result of migration.

In particular, in the case where the pieces of the $SiO_2$ mask 66 are as wide as several hundred μm or greater, the unevenness of the distribution in the film thickness of the i type InP clad layer portions 67 tends to be significant. In the case where such unevenness of the distribution of the film thickness occurs, the i type InP clad layer portions 67 are too thick in close proximity to the $SiO_2$ mask 66, and the i type InP clad layer portions 67 protrude from the p type InP clad layer portions 64 (from the p type InGaAsP contact layer 65).

When such protrusions are created, it becomes easy for a problem to occur, such as peeling off of the $SiO_2$ mask 68 with a protrusion as the starting point, during the process steps after that in FIGS. 14A to 14C, and at the same time, such a problem arises that the pattern precision lowers. Conversely, the i type InP clad layer portions 67 are thin in the locations away from the $SiO_2$ mask 66. In this case, such a problem arises that propagation loss of the light that propagates through the waveguide is great.

SUMMARY

According to one aspect of the disclosure, an integrated semiconductor optical element is provided with a waveguide in stripe form having a multilayer structure where at least a first conductivity type lower clad layer, a waveguide core layer and an upper clad layer are layered on top of a semiconductor substrate, and is characterized in that the upper clad layer has: second conductivity type upper clad layer portions that are of the conductivity type opposite to the first conductivity type and are separated from each other in the direction in which the waveguide runs; and an i type upper clad layer portion that connects the separated second conductivity type upper clad layer portions, and at least one waveguide region provided with an i type upper clad layer portion and at least two waveguide regions provided with a second conductivity type upper clad layer portion are shifted from each other in the direction perpendicular to the main direction in which the waveguide runs, and the waveguide region provided with an i type upper clad layer portion and the waveguide regions provided with a second conductivity type upper clad layer portion are connected through bent portions.

According to another aspect of the disclosure, a manufacturing method for an integrated semiconductor optical circuit apparatus is provided with and characterized by including: depositing at least a first conductivity type lower clad layer, a waveguide core layer and a second conductivity type upper clad layer that are of the conductivity type opposite to the first conductivity type in this order on a semiconductor substrate; forming a first insulating film mask in linear stripe form on the upper side of the second conductivity type upper clad layer; selectively removing the exposed portions of the second conductivity type upper clad layer using the first insulating film mask as an etching mask; regrowing an i type upper clad layer in the portions from which the second conductivity type upper clad layer has been removed using the first insulating film mask as a selective growth mask; forming after the removal of the first insulating film mask a second insulating film mask having a pattern of stripes in the direction in which the stripes of the first insulating film mask run, including at least two portions formed on the regions corresponding to the second conductivity type upper clad layer portions, a portion formed on the region corresponding to the i type upper clad layer portion, and bending portions for connecting the portions formed on the regions corresponding to the second conductivity type upper clad layer portions to the portion formed on the region corresponding to the i type upper clad layer portion; and forming a waveguide by carrying out etching using the second insulating film mask as an etching mask until at least a part of the first conductivity type lower clad layer is removed.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIGS. 2A and 2B are diagrams illustrating the basic manufacturing process for the integrated semiconductor optical element according to the embodiment of the present invention;

FIGS. 8A to 8C are diagrams illustrating the integrated semiconductor optical element according to Example 2 of the present invention;

FIGS. 9A to 9C are diagrams illustrating the manufacturing process for the integrated semiconductor optical element according to Example 2 of the present invention up to a step in the middle of the process;

DESCRIPTION OF EMBODIMENTS

Figure 1A:
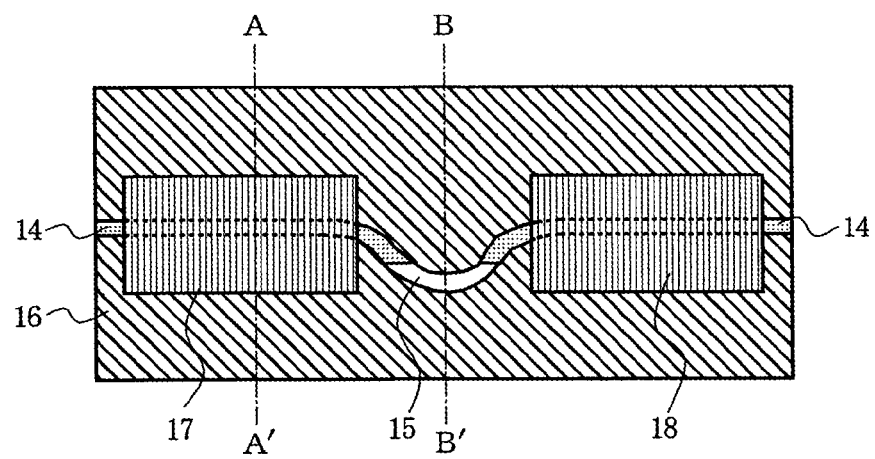
FIGS. 1A to 1C are diagrams illustrating the integrated semiconductor optical element according to an embodiment of the present invention.
Figure 1B:
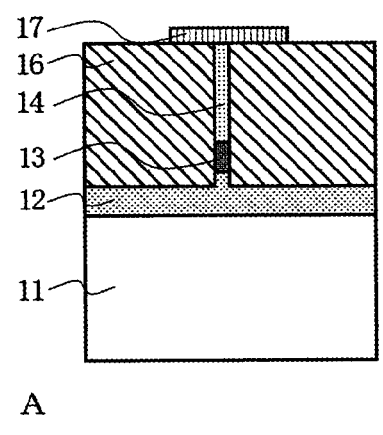
Figure 1C:
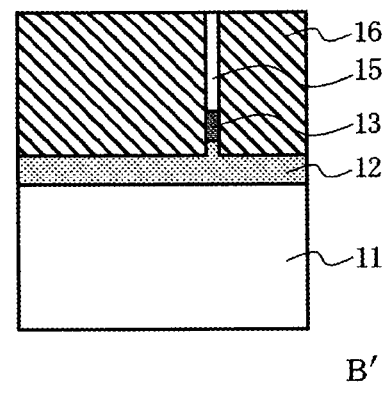

Here, the integrated semiconductor optical element according to an embodiment of the present invention is described in reference to FIGS. 1A to 2B. FIGS. 1A to 1C are diagrams illustrating the integrated semiconductor optical element according to the embodiment of the present invention, where FIG. 1A is a plan diagram, FIG. 1B is a cross-sectional diagram along the single-dotted chain line A-A' in FIG. 1A, and FIG. 1C is a cross-sectional diagram along the single-dotted chain line B-B' in FIG. 1A.

The integrated semiconductor optical element according to the embodiment of the present invention is provided with a waveguide in stripe form having a multilayer structure where at least a first conductivity type lower clad layer 12, a waveguide core layer 13 and an upper clad layer are layered on a semiconductor substrate 11. The upper clad layer has second conductivity type upper clad layer portions 14 that are of the conductivity type opposite to the first conductivity type and are separated from each other in the direction in which the waveguide runs, and an i type upper clad layer portion 15 that connects the separated second conductivity type upper clad layer portions 14.

Here, the waveguide region provided with the i type upper clad layer portion 15 is shifted from the waveguide in the direction perpendicular to the main direction in which the waveguide runs, and thus has a bent portion. It is desirable for the width of the shift of the waveguide region provided with the i type upper clad layer 15 in the direction perpendicular to the main direction in which the waveguide runs to be minimum in the required range, for example, 20 μm or less, so that the waveguide loss does not become great. The waveguide in stripe form is buried in an embedded insulating film 16 made of an organic insulator such as a benzocyclobutene (BCB) resin or the like, and electrodes 17, 18 are provided in the respective active regions. Here, the embedded insulator 16 is not limited to an organic insulator, and a semi-insulating semiconductor layer such as an Fe-doped InP layer may be used.

In addition, the waveguide region provided with the i type upper clad layer portion 15 may be bent in arc form. Alternatively, the waveguide region provided with the i type upper clad layer portion 15 and the waveguide regions provided with a second conductivity type upper clad layer portion 14 may be formed of a linear portion that is parallel to the main direction in which the waveguide runs and bent portions connected to the two ends of the linear portion. In this case, a bent portion of the waveguide region provided with the i type upper clad layer portion 15 and a bent portion of the waveguide regions provided with a second conductivity type upper clad layer portion 14 are connected to form a waveguide portion in S shape.

Furthermore, one of the waveguide regions provided with a second conductivity type upper clad layer portion 14 may be a distributed feedback semiconductor laser, and the other waveguide region provided with a second conductivity type upper clad layer portion 14 that faces the distributed feedback semiconductor laser with the waveguide region provided with the i type upper clad layer portion 15 in between may be an optical modulator or a semiconductor optical amplifier. Here, a diffraction grating is formed in a portion of the multilayer structure of the waveguide region including the distributed feedback semiconductor laser. In addition, it is desirable to use a multiple quantum well active layer for the waveguide core layer having a multilayer structure.

Alternatively, two modulation waveguide arms where an i type upper clad layer portion 15 and second conductivity type clad layer portions 14 are aligned so as to alternate are provided with electrodes individually formed on the regions that correspond to the second conductivity type upper clad layer portions 14 in the modulator waveguide, and thus, a capacitor-loaded MZ modulator may be provided. In this case, 1×2 couplers are connected to the two ends of the two modulator waveguide arms so that the waveguide input is connected to one 1×2 coupler and the output waveguide is connected to the other 1×2 coupler. Here, the waveguide region provided with the i type upper clad layer portion 15 may be bent in arc form, and the waveguide regions provided with a second conductivity type upper clad layer portion 14 may be bent in arc form in the direction opposite to the direction in which the waveguide region provided with the i type upper clad layer portion 15 is bent.

Next, the basic manufacturing process for the integrated semiconductor optical element according to the embodiment of the present invention is described in FIGS. 2A and 2B. Each diagram includes a plan diagram on the upper side and a cross-sectional diagram on the bottom side along the single-dotted chain line A-A' in the plan diagram. First, the following steps are carried out until the formation of the structure in FIG. 2A. At least a first conductivity type lower clad layer 12, a waveguide core layer 13 and a second conductivity type upper clad layer 14 are deposited sequentially on a semiconductor substrate 11.

Next, a first insulating film mask 19 in stripe form is formed on the upper side of the second conductivity type upper clad layer 14, and the exposed portions of the second conductivity type upper clad layer 14 are selectively removed using the first insulating film mask 19 as an etching mask. Then, the first insulating film mask 19 is used as a selective growth mask as it is so as to regrow an i type upper clad layer 15 in the portions from which the second conductivity type upper clad layer 14 has been removed.

Next, the following steps are carried out until the formation of the structure in FIG. 2B. The first insulating film mask 19 is removed. Then, a second insulating film mask 20 is formed so as to have a pattern of stripes along the direction in which the stripes of the first insulating film mask 19 run and at least two portions on the second conductivity type upper clad layer portions 14, the portion on the i type upper clad layer portion 15, and portions for connecting the portions on the second conductivity type upper clad layer portions 14 to the portion on the i type upper clad layer portion 15. Next, the second insulating film mask 20 is used as an etching mask so that etching is carried out until at least part of the first conductivity type lower clad layer 12 is removed, and thus, a waveguide is formed. After the formation of the waveguide, the waveguide may be embedded in an organic insulator such as of BCB, or the second insulating film mask 20 may be used as a selective growth mask as it is so as to regrow a semi-insulating semiconductor layer.

Here, it is desirable for the width of the stripes of the first insulating film mask 19 to be 20 μm or less, which is the same as or greater than the width of the stripes of the waveguide and with which the selective growth effects do not appear significantly. In addition, the second insulating film mask 20 may have a stripe that is bent above a region that corresponds to the i type upper clad layer portion 15 or a second conductivity type upper clad layer portion 14.

Thus, in the embodiment of the present invention, the width of the first insulating film mask 19 is 20 μm or less, typically several μm to 20 μm, and therefore, the selective growth effects do not appear significantly. As a result, film thickness is not different between the portions in close proximity to and away from the first insulating film mask 19, and thus is uniform, which prevents any steps from being created in the edge of the first insulating film mask 19, that is to say, along the border between the second conductivity type upper clad layer portions 14 and the i type upper clad layer portion 15. Furthermore, it is possible to ensure a uniform thickness of the i type upper clad layer portion 15 even in a location away from the first insulating film mask 19.

It is also possible to switch the i type upper clad layer portion 15 and the second conductivity type upper clad layer portions 14 in the direction in which the waveguide runs by shifting the waveguide in the direction perpendicular to the main direction in which the waveguide runs, that is to say, the direction in which the stripes of the first insulating film mask 19 run. Such an arrangement of the waveguide pattern is possible without adding any particular steps because only the design of the patterning mask for the formation of the second insulating film mask 20 can be changed to implement this arrangement. Here, the amount of shift between the waveguide region with the i type upper clad layer portion and the waveguide regions with a second conductivity type upper clad layer portion is made at least greater than the width of the waveguide in order to ensure that the i type upper clad layer portion and the second conductivity type upper clad layer portions switch.

Accordingly, it is easy to fabricate the waveguide structure where the i type upper clad layer portion 15 and the second conductivity type upper clad layer portions 14 partially switch without any increase in the difficulty of the following manufacturing process or any increase in the waveguide loss due to the unevenness of the distribution that occurs in the film thickness of the i type upper clad layer 15.

Example 1

Figure 3A:
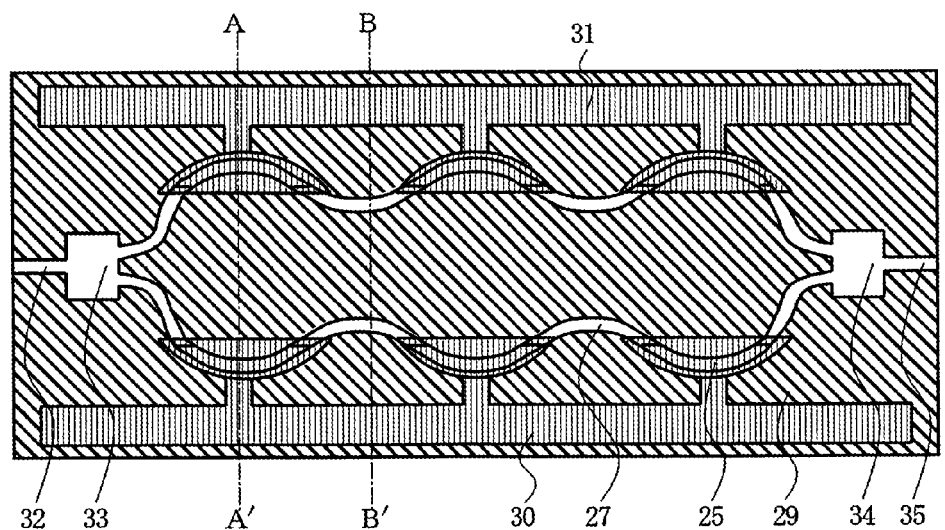
FIGS. 3A to 3C are diagrams illustrating the capacitor-loaded MZ type modulator according to Example 1 of the present invention.

Next, the capacitor-loaded MZ type modulator according to Example 1 of the present invention is described in reference to FIGS. 3A to 6C. FIGS. 3A through 3C are diagrams illustrating the capacitor-loaded MZ type modulator according to Example 1 of the present invention. FIG. 3A is a plan diagram, FIG. 3B is a cross-sectional diagram along the single-dotted chain line A-A' in FIG. 3A, and FIG. 3C is a cross-sectional diagram along the single-dotted chain line B-B' in FIG. 3A. This capacitor-loaded MZ type modulator is provided with an input waveguide 32, a 1×2 MMI (multiple mode interference) waveguide 33, two meandering modulating waveguides, a 2×1 MMI waveguide 34 and an output waveguide 35.

Figure 3B:
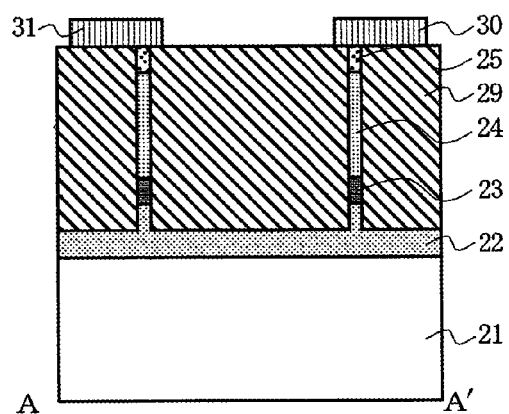
Figure 3C:
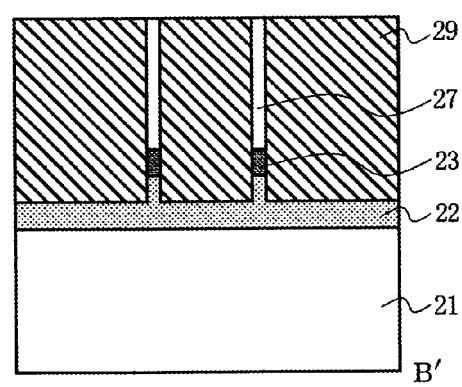

The two modulating waveguides have such a structure that waveguide portions in which an electrode 30 or 31 is formed and waveguide portions in which no electrodes are formed are arranged so as to alternate. As illustrated in FIG. 3B, the waveguide portions connected to the electrode 30 or 31 have such a multilayer structure formed of an n type InP clad layer 22 having a thickness of 1 μm, an i type InGaAsP-MQW core layer 23 having a thickness of 0.5 μm, a p type InP clad layer 24 having a thickness of 1.5 μm, and a p type InGaAsP contact layer 25 having a thickness of 0.5 μm that are sequentially layered on top of a semi-insulating InP substrate 21. Meanwhile, as illustrated in FIG. 3C, the waveguide portions in which no electrodes are formed have such a multilayer structure formed of an n type InP clad layer 22, an InGaAsP-MQW core layer 23 and an i type InP clad layer 27 having a thickness of 2.0 μm that are sequentially layered on the semi-insulating InP substrate 21. Here, the InGaAsP-MQW core layer 23 is formed so that the band gap wavelength becomes 1.40 μm, which makes the absorption low and sufficiently causes the quantum confinement Stark effect through the application of an electrical field, under the assumption as being used as a modulator for the band of 1.55 µm, for example.

The modulating waveguides have a high mesa structure where the stripe is created through etching up to the middle portion of the n type InP clad layer 22, has a width of 1.5 µm, and is embedded in an embedding insulating film 29 made of benzocyclobutene (BCB) with a thin $SiO_2$ film in between on the sides. In addition, the meandering modulating waveguides have such a pattern that arcs having a curvature of 300 µm and an angle of 10.5° are alternately inverted and connected, where the waveguide is positionally shifted by approximately 10 µm between the outermost portion and the innermost portion in the direction perpendicular to the direction in which the waveguide runs, and the pattern meanders in repeating patterns of approximately 200 µm. By using the pattern formed of arcs, it becomes possible to positionally shift a waveguide region in which the p type InP clad layer 24 is provided and a waveguide region in which the i type InP clad layer 27 is provided by a necessary distance, which is the shortest in the case that a fixed curvature radius is assumed, in the direction perpendicular to the direction in which the waveguide runs. In addition, it is more preferable for the waveguide regions made of the p type InP clad layer 24 to be on the outside as in FIG. 3A because this arrangement can suppress interference between the waveguides and the electrodes.

Figure 4A:
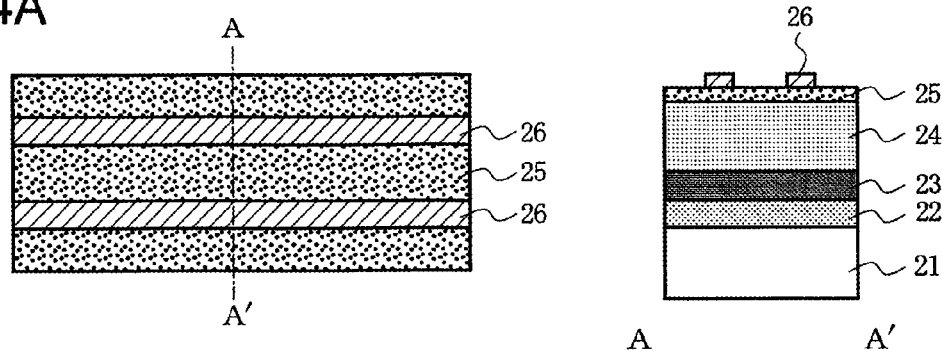
FIGS. 4A to 4C are diagrams illustrating the manufacturing process for the capacitor-loaded MZ type optical modulator according to Example 1 of the present invention up to a step in the middle of the process.
Figure 4B:
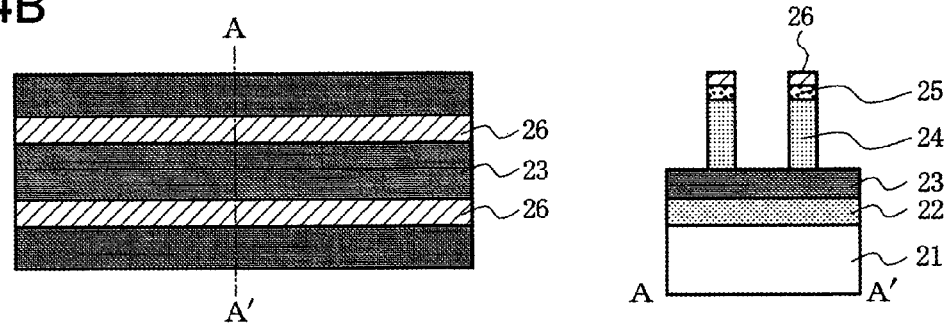
Figure 4C:
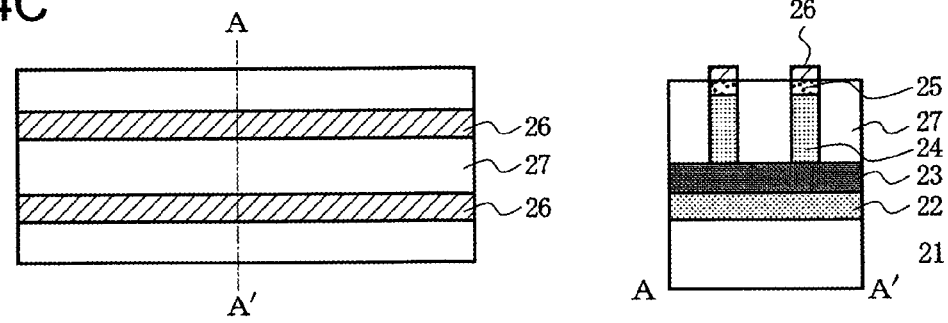
Figure 5A:
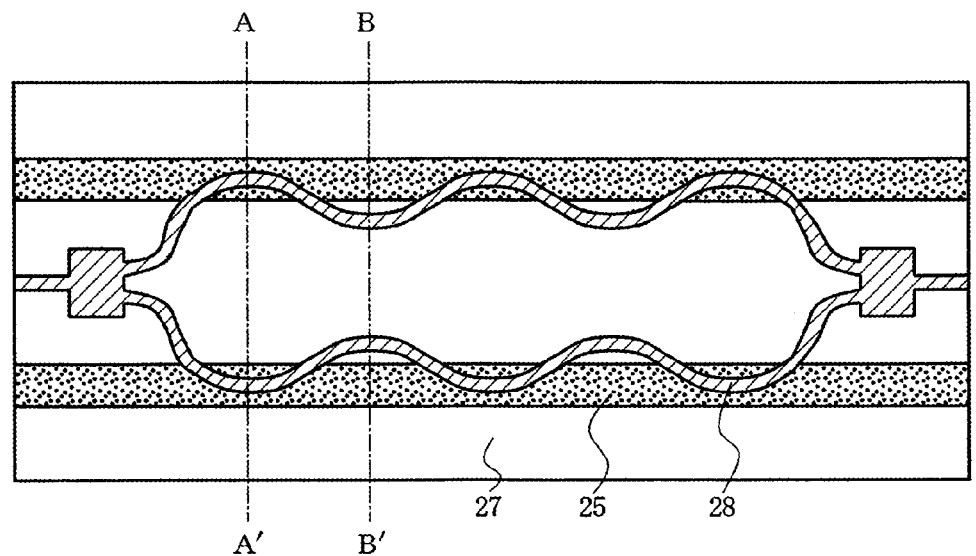
FIGS. 5A to 5C are diagrams illustrating the manufacturing process for the capacitor-loaded MZ type optical modulator according to Example 1 of the present invention after the step in FIG. 4C and up to another step in the middle of the process.
Figure 5B:
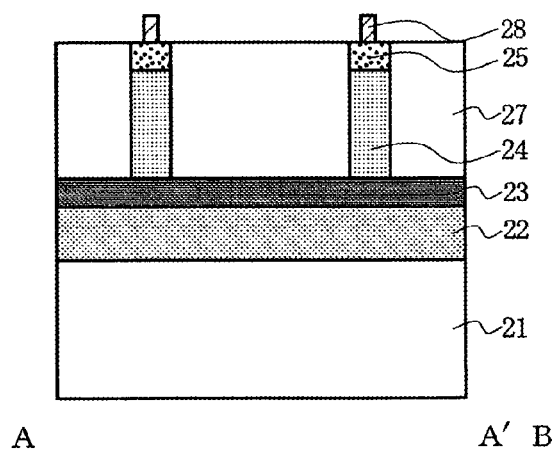
Figure 5C:
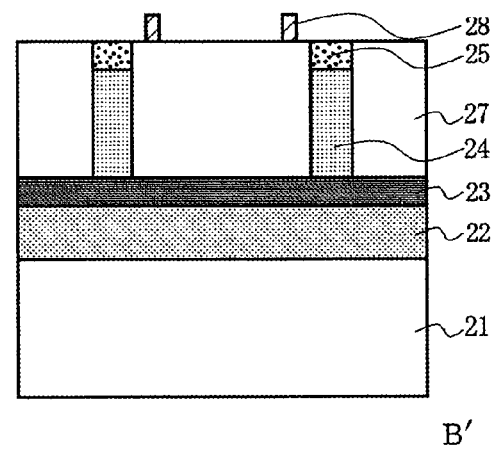
Figure 6A:
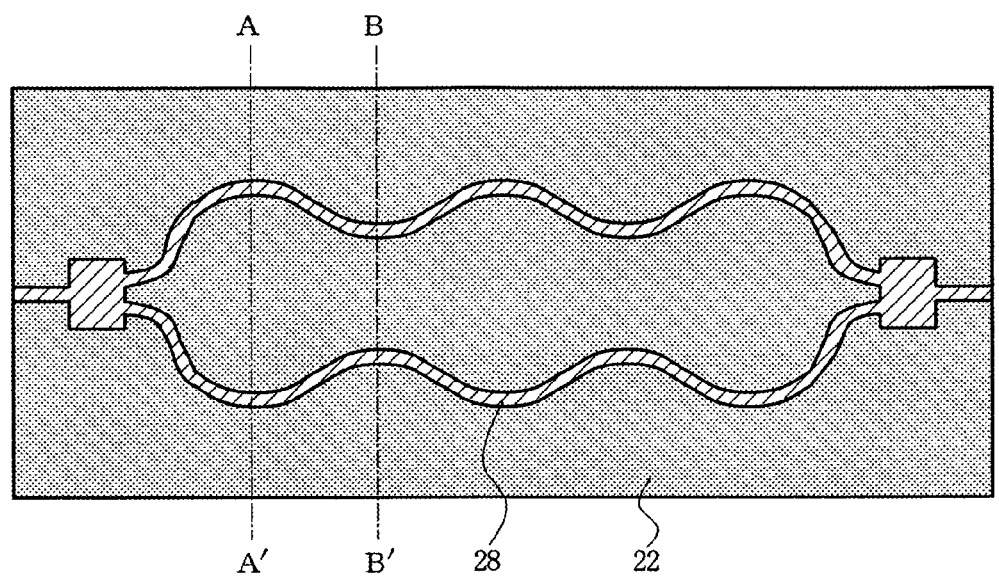
FIGS. 6A to 6C are diagrams illustrating the manufacturing process for the capacitor-loaded MZ type optical modulator according to Example 1 of the present invention after the step in FIGS. 5A to 5C.
Figure 6B:
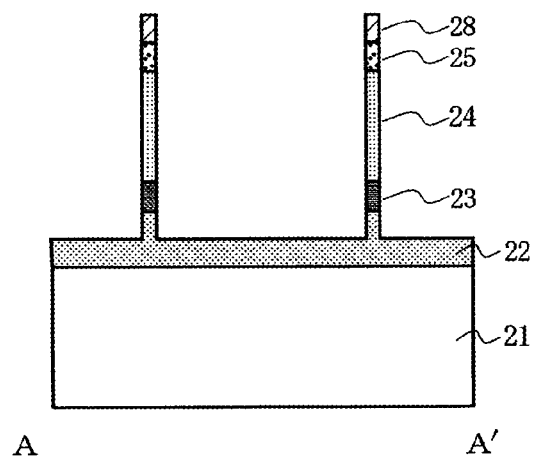
Figure 6C:
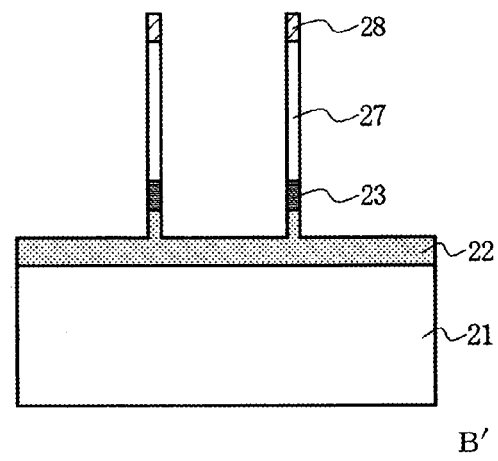

Next, the manufacturing process for the capacitor-loaded MZ type modulator according to Example 1 of the present invention is described in reference to FIGS. 4A to 6C. The diagrams on the left side in FIGS. 4A through 4C are plan diagrams, and the diagrams on the right side are cross-sectional diagrams along the single-dotted chain line A-A' in the diagram on the left side. FIGS. 5A and 6A are plan diagrams, and FIGS. 5B and 6B are cross-sectional diagrams along the single-dotted chain line A-A' in the plan diagram. FIGS. 5C and 6C are cross-sectional diagrams along the single-dotted chain line B-B' in the plan diagram.

As illustrated in FIG. 4A, first, an n type InP clad layer having a thickness of 1 µm, an i type InGaAsP-MQW core layer having a thickness of 0.5 µm, a p type InP clad layer having a thickness of 1.5 µm, and a p type InGaAsP contact layer 25 having a thickness of 0.5 µm are sequentially grown on a semi-insulating InP substrate 21. Next, an $SiO_2$ mask 26 having stripes with a width of 10 µm and a gap of 20 µm is formed.

Next, as illustrated in FIG. 4B, wet etching is carried out using the $SiO_2$ mask as an etching mask so that a p type InGaAsP contact layer 25 and a p type InP clad layer 24 are left as a result of mesa etching.

Next, as illustrated in FIG. 4C, the $SiO_2$ mask 26 is used as it is as a selective growth mask so that an i type InP clad layer 25 is regrown so as to be approximately at the same level as the upper surface of the p type InGaAsP contact layer 25. At this time, the width of the $SiO_2$ mask 26 is 10 µm, and therefore, a flat layer having no uneven distribution of the film thickness is formed without the selective growth effect significantly appearing.

Next, as illustrated in FIGS. 5A through 5C, the $SiO_2$ mask 26 is removed, and after that, an $SiO_2$ mask 28 is formed with patterns for an input waveguide, a 1×2 MMI waveguide, two modulating waveguides, a 2×1 MMI waveguide and an output waveguide. The pattern for the two modulating waveguides in this $SiO_2$ mask 28 is formed of arcs having a width of 1.5 µm, a curvature of 300 µm and an angle of 10.5° that are inverted and connected to each other. The waveguides are positionally shifted by approximately 10 µm between the outermost portions and the innermost portions in the direction perpendicular to the direction in which the waveguides run. The pattern is created so that the center lines of the meandering portions in repeating patterns of approximately 200 µm are positioned along the borders between p type InGaAsP contact layer portions 25 and the i type InP clad layer portions 27.

Next, as illustrated in FIGS. 6A through 6C, dry etching is carried out up to the middle portion of the n type InP clad layer 22 using the $SiO_2$ mask 28 as an etching mask so that waveguides having a high mesa structure are formed. The use of a dry etching technology for the formation of waveguides makes it possible to precisely prepare curved waveguides and MMI waveguides without being affected by the dependency on the plane direction. Here, the 1×2 MMI waveguide, the 2×1 MMI waveguide, and the input and output waveguides are located inside the modulating waveguides, and therefore, the clad layer of these are the i type InP clad layer 27.

After that, the $SiO_2$ mask 28 is removed, and then the spaces on the two sides of the mesas are filled in with a BCB resin with a thin $SiO_2$ film in between, and subsequently, the top of the p type InGaAsP contact layer 25 is exposed. Next, electrodes are formed on individual waveguides so as to make contact with the exposed p type InGaAsP contact layer 25. These individual electrodes on the waveguides are connected to wide electrodes so that the capacitor-loaded MZ type modulator in FIGS. 3A through 3C can be obtained.

As described above, according to Example 1 of the present invention, a selective growth mask having such a width as to prevent the selective growth effect from significantly appearing is used to regrow an i type InP clad layer, and therefore, the i type InP clad layer becomes a flat layer without uneven distribution of the film thickness, and the loss from the waveguides can be greatly reduced. In addition, the entire surface becomes flat, and therefore, the $SiO_2$ mask does not peel when waveguides are formed and the precision in the pattern increases, and thus, the difficulty in manufacturing the elements can be greatly reduced. Here, the structure where waveguides are curved as the modulating waveguides in Example 1 of the present invention has such advantages that it is easy to adjust the difference in the propagation rate between the electrical signal and the optical signal so that rate matching can be achieved.

Figure 7A:
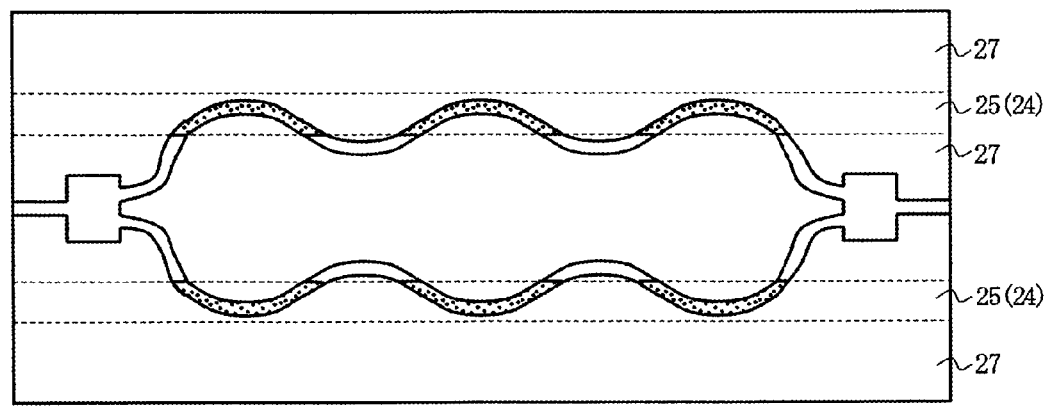
FIGS. 7A to 7C are diagrams illustrating a modification of the waveguide pattern of the capacitor-loaded MZ type optical modulator according to Example 1 of the present invention.
Figure 7B:
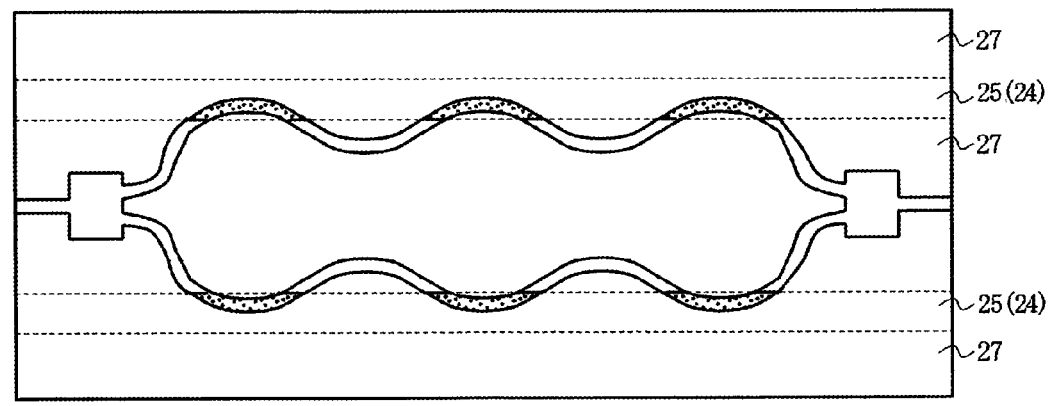
Figure 7C:

Next, a modification of the waveguide pattern in the capacitor-loaded MZ type modulator according to Example 1 of the present invention is described in reference to FIGS. 7A through 7C. In the above description, the waveguide portions provided with the p type InP clad layer 24 and the waveguide portions provided with the i type InP clad layer 27 are equally arranged in the meandering modulating waveguide pattern; however, it is not essential for them to be equally arranged.

FIGS. 7A through 7C are diagrams illustrating a modification of the waveguide pattern of the capacitor-loaded MZ type modulator according to Example 1 of the present invention. FIG. 7A illustrates a case where the modulating waveguide is formed close to the waveguide portions provided with the p type InP clad layer 24. In contrast, FIG. 7B illustrates a case where the modulating waveguide is formed close to the waveguide portions provided with the i type InP clad layer 27. Thus, the position of the meandering waveguide can be displaced in the direction perpendicular to the direction in which the waveguide runs so that it becomes possible to appropriately change the ratio of the length of the waveguide portions provided with the p type InP clad layer 24 on which divided electrodes are formed to the length of the waveguide portions provided with the i type InP clad layer 27 that become isolation portions between the electrodes.

FIG. 7C illustrates the connection between linear waveguide portions that are shifted relative to the direction in which the waveguide runs with waveguide portions in S shape. That is to say, the waveguide regions provided with the p type InP clad layer 24 and the waveguide region provided with the i type InP clad layer 27 are formed of a linear portion and bent portions connected to the two ends of the linear portion, and connection waveguide portions in S shape are provided when two bent portions are connected to each other. As for the comparison between the p type and i type clay layers, optical loss is smaller in the i type InP clad layer 27, and therefore, it is desirable to provide a waveguide pattern so that not only the isolation portions between electrodes, but also the portions on which no electrode is formed are in the i type InP clad layer as much as possible.

In the case where the ratio of the length of the divided electrode forming portions to the length of the isolation portions is changed as described above in accordance with the prior art, it is necessary to change the width of and the gap between the waveguide portions in the direction parallel to the waveguide in the selective growth mask. This affects the degree of the selective growth effects of the i type InP clad layer, and therefore, it becomes necessary to change the conditions for growth of the i type InP clad layer in the case when the ratio is changed. In the case where the ratio is changed within the same wafer, the rate of growth of the i type InP clad layer differs, which makes it difficult to control the growth of the i type InP clad layer so as to have an appropriate thickness for all the ratios.

Meanwhile, according to the present invention, an $SiO_2$ mask having a constant waveguide width irrespective of the ratio of the portions in which a divided electrode is formed is used up to the regrowth of the i type InP clad layer, and the waveguide pattern can be arranged so as to change the ratio of the portions in which a divided electrode is formed. Accordingly, it is not necessary to change the conditions for the growth of the i type InP clad layer depending on this ratio, and there is no uneven distribution in the thickness of the i type InP clad layer even when elements having different ratios are fabricated within the same wafer.

Example 2

Next, the integrated semiconductor optical element according to Example 2 of the present invention is described in reference to FIGS. 8A through 11C. Here, an integrated semiconductor optical element in which a distributed feedback (DFB) semiconductor laser and a semiconductor optical amplifier (SOA) are integrated is described. FIGS. 8A through 8C are diagrams illustrating the integrated semiconductor optical element according to Example 2 of the present invention, where FIG. 8A is a plan diagram, FIG. 8B is a cross-sectional diagram along the single-dotted chain line A-A' in FIG. 8A, and FIG. 8C is a cross-sectional diagram along the single-dotted chain line B-B' in FIG. 8A.

As illustrated in FIG. 8A, a waveguide portion for forming the DFB semiconductor laser and a waveguide portion for forming the semiconductor optical amplifier are arranged in the same position relative to the direction perpendicular to the direction in which the waveguide runs. In the isolation unit, the waveguide is bent and positionally shifted from the DFB unit and the SOA unit in the direction perpendicular to the direction in which the waveguide runs.

The length of the waveguide portion in the DFB unit is 300 µm, for example, and the length of the waveguide portion in the SOA unit is 300 µm, for example. The isolation unit has such a structure that waveguide portions in S shape having a curvature of 100 µm and a bent angle of 5° are connected to each other, and the total length is 100 µm. In this pattern, the waveguide portion in the isolation unit is positionally shifted by a maximum of 10 µm relative to the waveguide portions in the SOA unit and the DFB unit.

FIG. 8B illustrates the layer structure of the waveguide in the DFB unit and the SOA unit. In this structure, an n type InP buffer layer 42 having a thickness of 1 µm, an InGaAsP diffraction grating layer 43, an n type InP spacer layer 44, an i type InGaAsP-MQW active layer 45 having a thickness of 0.2 µm, a p type InP clad layer 46 having a thickness of 1.5 µm, and a p type InGaAsP contact layer 47 having a thickness of 0.5 µm are layered sequentially on a semi-insulating InP substrate 41. Here, the i type InGaAsP-MQW active layer 45 has a band gap wavelength of 1.58 µm so that optical gains are achieved for a 1.55 µm band, for example. In order to form a diffraction grating in the DFB unit, at least portions of the InGaAsP diffraction grating layer 43 are removed at same intervals.

Meanwhile, FIG. 8C illustrates the layer structure in the isolation unit. In this structure, an n type InP buffer layer 42 having a thickness of 1 µm, an InGaAsP diffraction grating layer 43, an n type InP spacer layer 44, an i type InGaAsP-MQW active layer 45 having a thickness of 0.2 µm, and an i type InP clad layer 49 having a thickness of 2.0 µm are sequentially layered on a semi-insulating InP substrate 41.

Waveguide mesas in the DFB unit, the SOA unit and the isolation unit all have an embedded waveguide structure having a width of 2.0 µm where etching had been carried out up to the middle portion of the n type InP buffer layer 42 and of which the spaces on both sides are embedded with an Fe-doped InP embedding layer 51.

Thus, the upper clad layer in the isolation unit is an i type layer, which makes it possible to provide sufficient electrical isolation between the SOA and the DFB at a short distance. By arranging bent waveguide portions in the isolation unit, it is also possible to remove excessive modes such as non-guided wave modes through radiation, and thus stabilize the operation of the integrated semiconductor optical element.

Figure 10A:
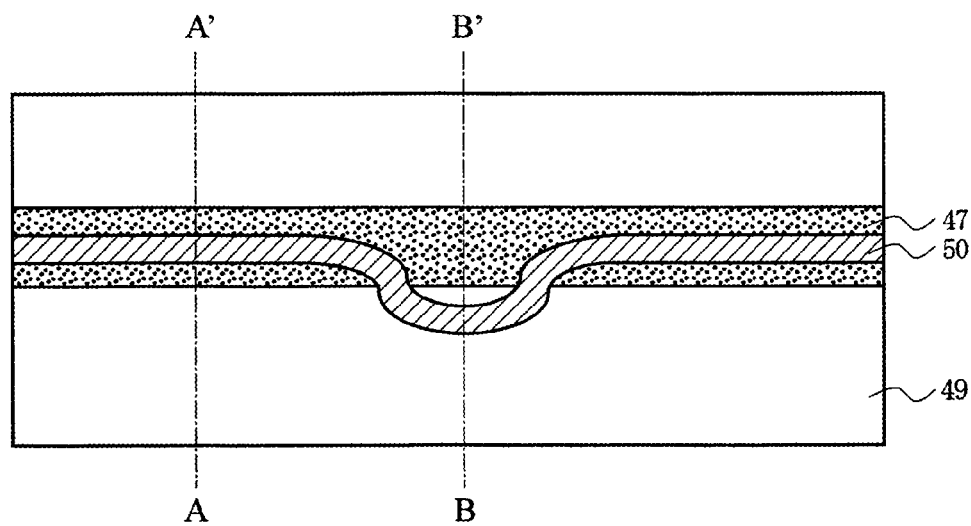
FIGS. 10A to 10C are diagrams illustrating the manufacturing process for the integrated semiconductor optical element according to Example 2 of the present invention after the step in FIG. 9C and up to another step in the middle of the process.
Figure 10B:
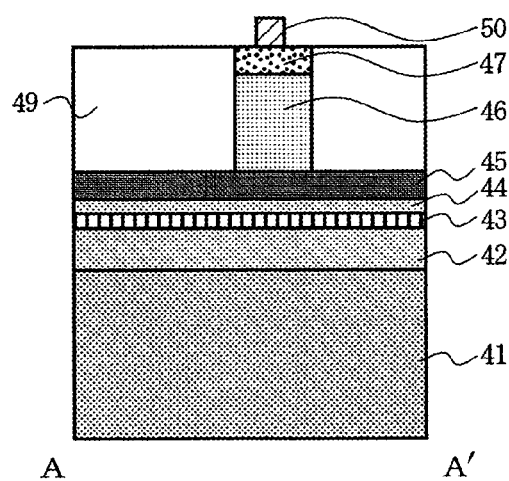
Figure 10C:
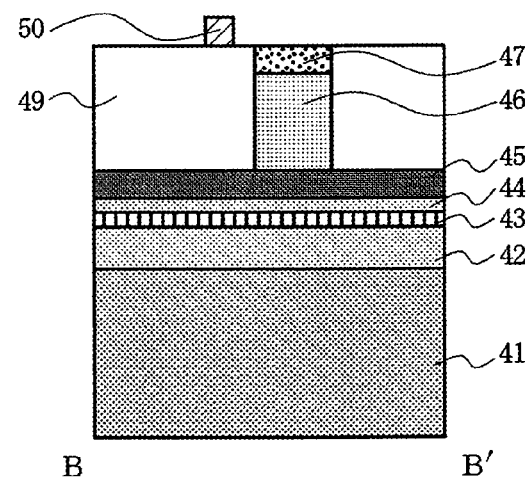
Figure 11A:
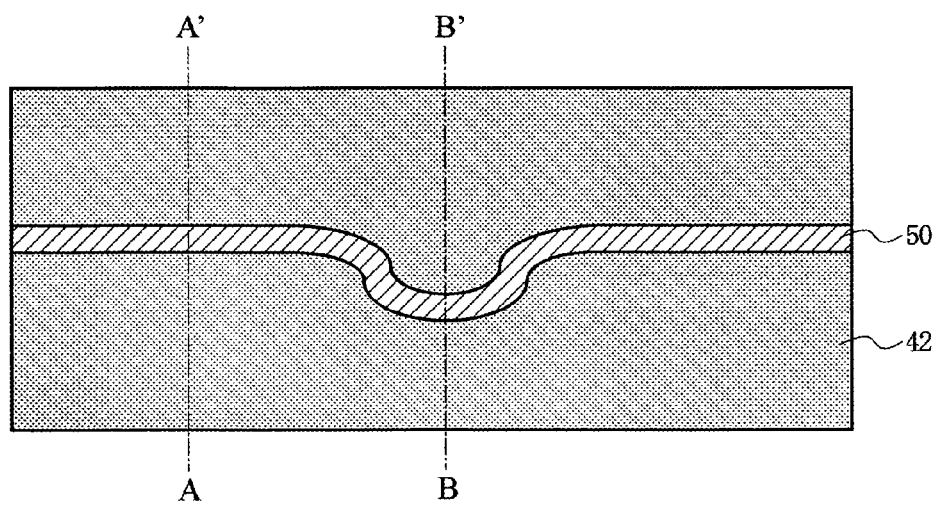
FIGS. 11A to 11C are diagrams illustrating the manufacturing process for the integrated semiconductor optical element according to Example 2 of the present invention after the step in FIGS. 10A to 10C.
Figure 11B:
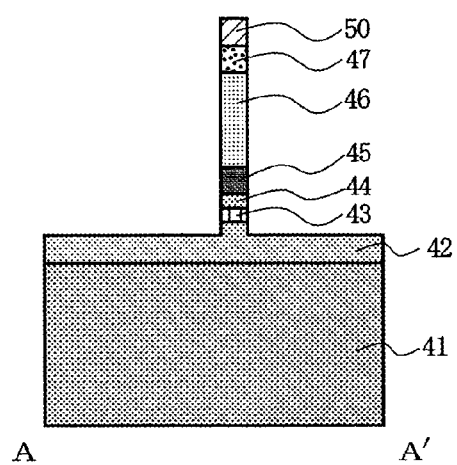
Figure 11C:
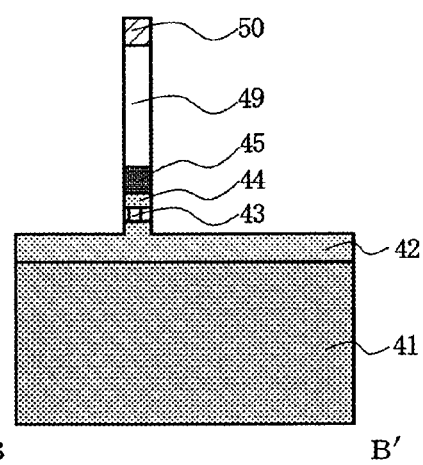
Figure 12A:
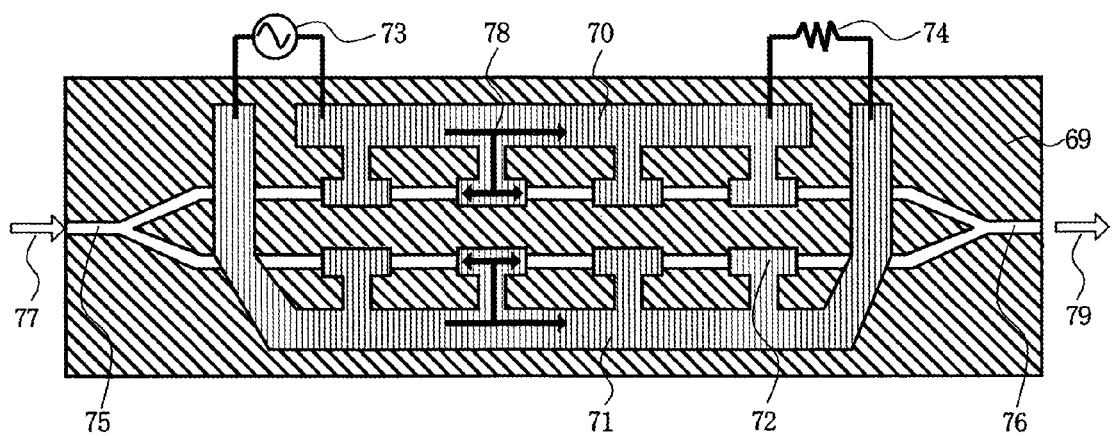
FIGS. 12A and 12B are diagrams illustrating a conventional capacitor-loaded MZ type modulator.
Figure 12B:
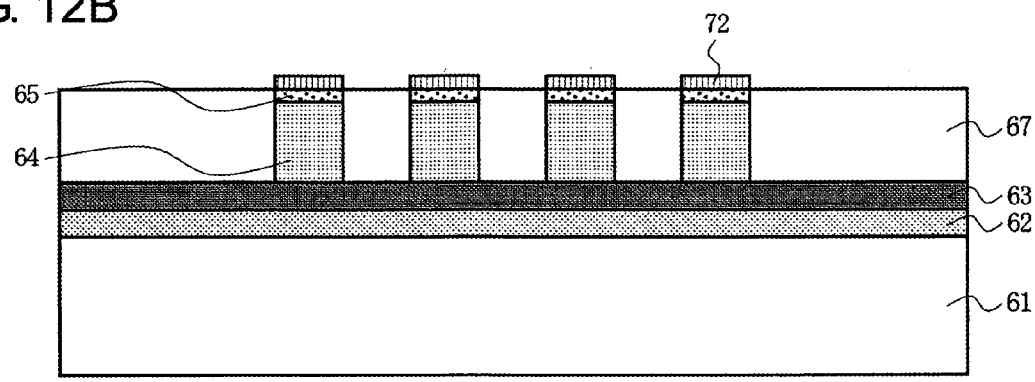
Figure 13A:
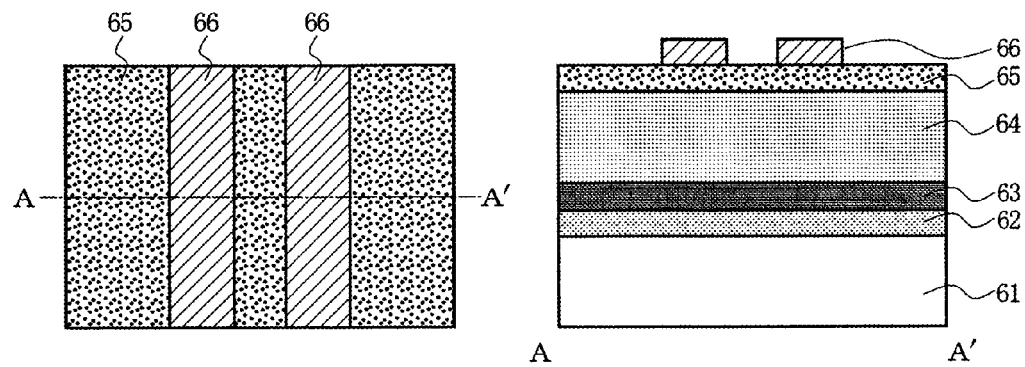
FIGS. 13A to 13C are diagrams illustrating the manufacturing process for the conventional capacitor-loaded MZ type optical modulator up to a step in the middle of the process.
Figure 13B:
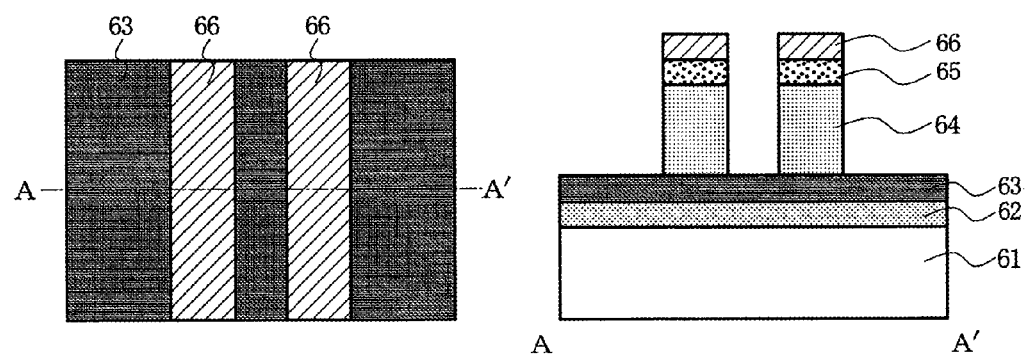
Figure 13C:
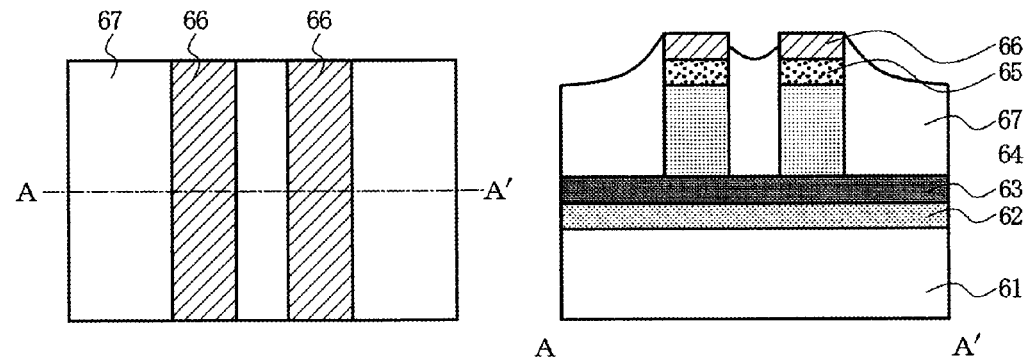
Figure 14A:
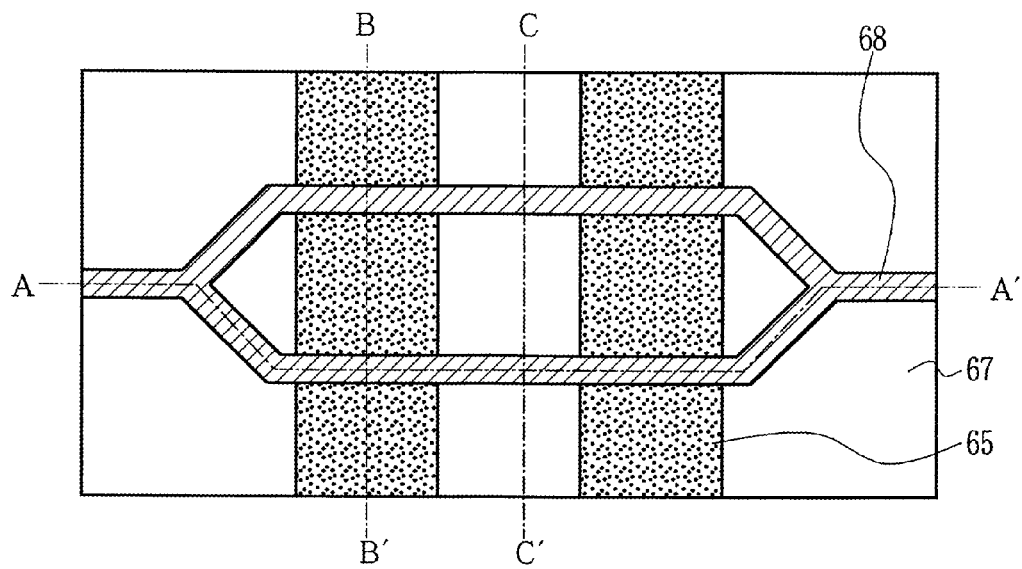
FIGS. 14A to 14C are diagrams illustrating the manufacturing process for the conventional capacitor-loaded MZ type optical modulator after the step in FIG. 13C and up to a step in the middle of the process.
Figure 14B:
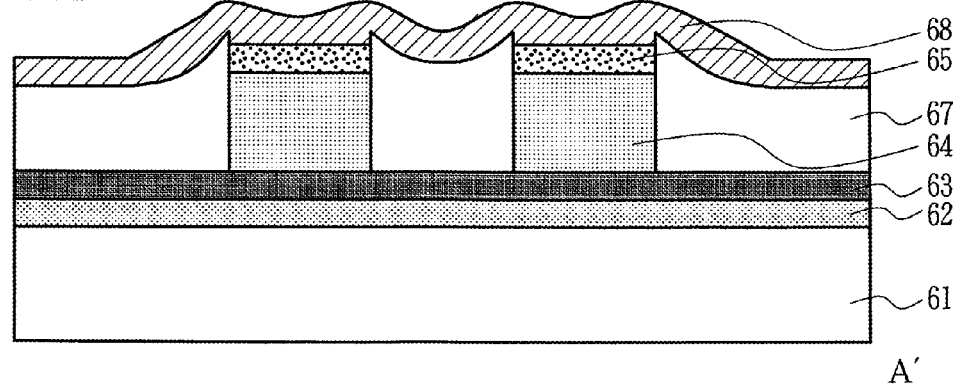
Figure 14C:
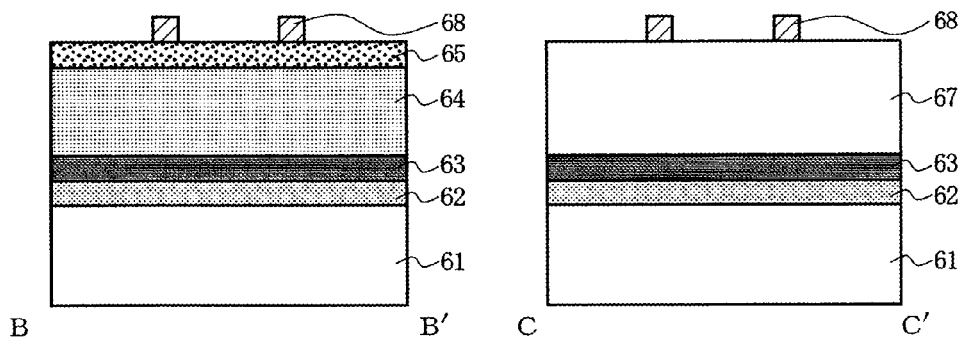
Figure 15A:
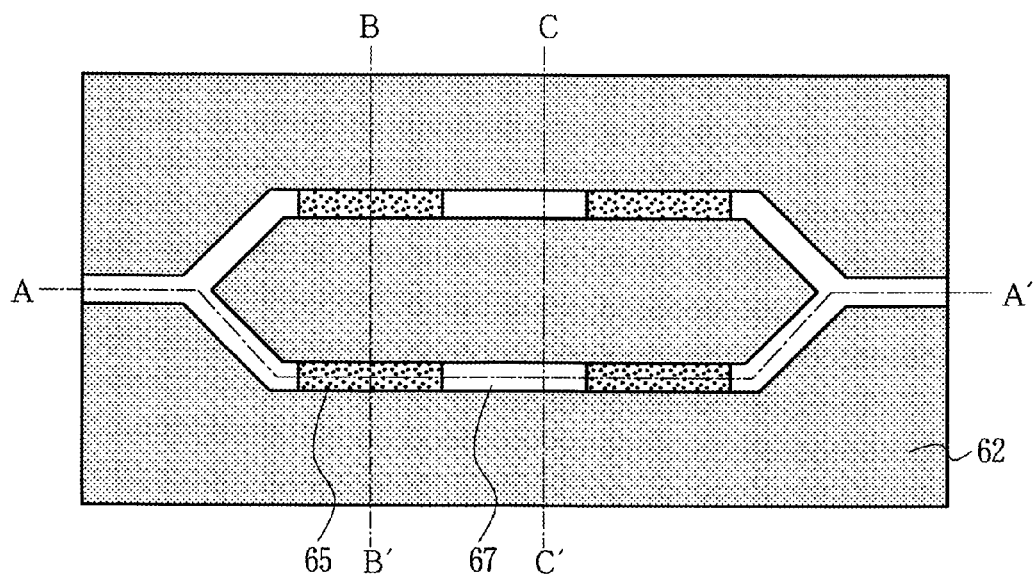
FIGS. 15A to 15C are diagrams illustrating the manufacturing process for the conventional capacitor-loaded MZ type optical modulator after the step in FIGS. 14A to 14C.
Figure 15B:
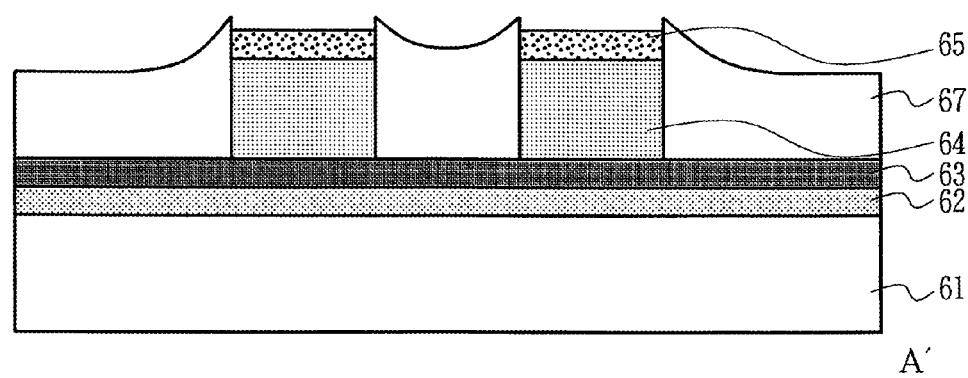
Figure 15C:
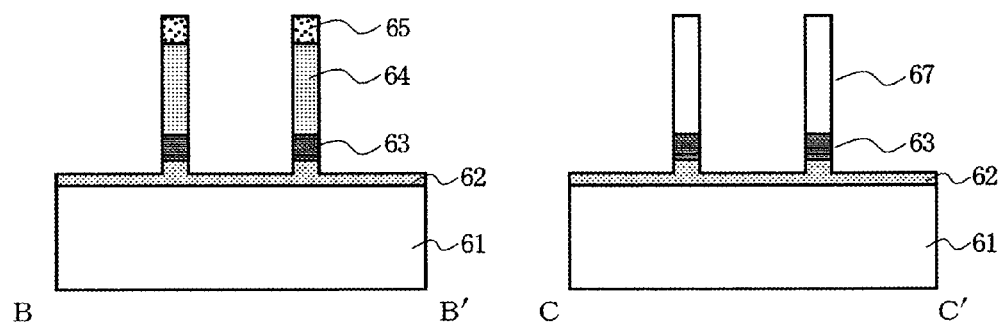

Next, the manufacturing process for the integrated semiconductor optical element according to Example 2 of the present invention is described in reference to FIGS. 9A through 11C. FIGS. 9A through 9C include on the left side a plan diagram and on the right side a cross-sectional diagram along the single-dotted chain line A-A' in the diagram on the left side. FIGS. 10A and 11A are plan diagrams, and FIGS. 10B and 11B are cross-sectional diagrams along the single-dotted chain line A-A' in the plan diagrams. In addition, FIGS. 10C and 11C are cross-sectional diagrams along the single-dotted chain line B-B' in the plan diagrams.

First, the following steps up to the formation of the structure in FIG. 9A are carried out. An n type InP buffer layer 42 having a thickness of 1 µm and an InGaAsP diffraction grating layer 43 are formed on a semi-insulating InP substrate, and after that, portions of the InGaAsP diffraction grating layer 43 at the same intervals are removed through etching only in the DFB unit so that a diffraction grating is formed. Next, an n type InP spacer layer 44, an i type InGaAsP-MQW active layer 45 having a thickness of 0.2 µm, a p type InP clad layer 46 having a thickness of 1.5 µm, and a p type InGaAsP contact layer 47 having a thickness of 0.5 μm are sequentially grown on the InGaAsP diffraction grating layer 43. Subsequently, a first SiO₂ mask 48 having a pattern of stripes in the direction in which the waveguide runs, of which the width is no smaller than the width of the waveguide and no greater than 10 μm, is formed on the p type InGaAsP contact layer 47.

Next, as illustrated in FIG. 9B, wet etching is carried out by using the SiO₂ mask 48 as an etching mask so that the p type InGaAsP contact layer 47 and the p type InP clad layer 46 are etched so as to form mesas in stripe form. Subsequently, as illustrated in FIG. 9C, the SiO₂ mask 48 is used as it is as a selective growth mask so that an i type InP clad layer 49 having a thickness of 2 μm is regrown.

Next, as illustrated in FIGS. 10A through 10C, the SiO₂ mask 48 is removed, and after that, an SiO₂ mask 50 is formed. The SiO₂ mask 50 is a mask for patterning a waveguide in the SOA unit and the DFB unit as well as the separation unit that is positionally shifted from the SOA unit and the DFB unit, wherein the waveguide in the SOA unit and the DFB unit is arranged so as to come close to the center in the direction of the width of the p type InGaAsP contact layer 47. The waveguide in the isolation unit is shifted from the DFB unit and the SOA unit by a maximum of 10 μm. The waveguide in the isolation unit is connected to the DFB unit and the SOA unit through waveguides in S shape.

Next, as illustrated in FIGS. 11A through 11C, dry etching is carried out until the n type InP buffer layer 42 is partially removed by using the SiO₂ mask 50 as an etching mask so that a waveguide having a high mesa structure is formed. In this structure, the DFB waveguide portion and the SOA waveguide portion where the clad layer above the waveguide core layer is the p type InP clad layer 46 and the isolation waveguide portion where the clad layer above the waveguide core layer is the i type InP clad layer 49 are shifted from each other in the direction perpendicular to the direction in which the waveguide runs.

After that, as illustrated in FIGS. 8A through 8C, the SiO₂ mask 50 is used as it is as a selective growth mask so as to regrow the Fe-doped InP embedding layer 51, which embeds the waveguide mesa. Subsequently, the SiO₂ mask 50 is removed, and then, a DFB electrode 52 is formed in the DFB unit and an SOA electrode 53 is formed in the SOA unit, and thus, the basic structure of the integrated semiconductor optical element according to Example 2 of the present invention is complete.

As described above in Example 2 of the present invention, it is possible to stably and uniformly form a structure where some clad portions above the core layer are made to be p type clad layer portions for making electrical isolation between the DFB element and the SOA element, and the other clad portions are made to be i type clad layer portions.

Though an InGaAsP/InP-based element using an InP substrate as the substrate is described in Examples 1 and 2, the present invention is not limited to this, and it is possible to apply the technology according to the present invention to an integrated semiconductor optical element formed on a GaAs substrate in the same manner. Though an InGaAsP-based material is used for the waveguide core layer, the invention is not limited to this, and an appropriate material such as an AlGaInAs-based material or a GaInAsN-based material may be selected so as to match the function of each element that is integrated. The clad material is also not limited to InP, and an appropriately selected compound semiconductor material may be used so as to match the core layer material and the substrate material in each case.

According to the disclosed integrated semiconductor optical element and a manufacturing method for the same, the difficulty in the manufacture of an element is reduced, and at the same time, it is possible to reduce the propagation loss of light.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. An integrated semiconductor optical element, comprising a waveguide in stripe form having a multilayer structure where at least a first conductivity type lower clad layer, a waveguide core layer and an upper clad layer are layered on top of a semiconductor substrate, characterized in that
   the upper clad layer has: second conductivity type upper clad layer portions that are of the conductivity type opposite to the first conductivity type and are separated from each other in the direction in which the waveguide runs; and an i type upper clad layer portion that connects the separated second conductivity type upper clad layer portions, and
   at least one waveguide region provided with the first conductivity type lower clad layer, the waveguide core layer and the i type upper clad layer portion and at least two waveguide regions provided with the first conductivity type lower clad layer, the waveguide core layer and the second conductivity type upper clad layer portion are shifted from each other in the direction perpendicular to the direction in which a main portion of the waveguide runs, and the waveguide region provided with the first conductivity type lower clad layer, the waveguide core layer and the i type upper clad layer portion and the waveguide regions provided with the first conductivity type lower clad layer, the waveguide core layer and the second conductivity type upper clad layer portion are connected through bent portions.

2. The integrated semiconductor optical element according to claim 1, characterized in that the waveguide in stripe form is embedded in a dielectric oxide film and an organic insulator.

3. The integrated semiconductor optical element according to claim 1, characterized in that the waveguide in stripe form is embedded in a semi-insulating semiconductor layer.

4. The integrated semiconductor optical element according to claim 1, characterized in that the i type upper clad layer portion is bent in arc form.

5. The integrated semiconductor optical element according to claim 1, characterized in that the waveguide region provided with the first conductivity type lower clad layer, the waveguide core layer and the i type upper clad layer portion and the waveguide regions provided with the first conductivity type lower clad layer, the waveguide core layer and the second conductivity type upper clad layer portion have a linear portion that is parallel to the main direction in which the waveguide runs and bent portions connected to the two ends of the linear portion, and a bent portion of the waveguide region provided with the first conductivity type lower clad layer, the waveguide core layer and the i type upper clad layer portion and a bent portion of the waveguide regions provided with the first conductivity type lower clad layer, the waveguide core layer and the second conductivity type upper clad layer portion are connected to form a waveguide portion in S shape.

6. The integrated semiconductor optical element according to claim 1, characterized in that
one of the waveguide regions provided with the first conductivity type lower clad layer, the waveguide core layer and the second conductivity type upper clad layer portion is a distributed feedback semiconductor laser,
another of the waveguide regions provided with the first conductivity type lower clad layer, the waveguide core layer and the second conductivity type upper clad layer portion facing the distributed feedback semiconductor laser with the waveguide region provided with the first conductivity type lower clad layer, the waveguide core layer and the i type upper clad layer portion in between is either an optical modulator or a semiconductor optical amplifier, and
a diffraction grating is formed in at least a portion of the multilayer structure of the waveguide region including the distributed feedback semiconductor laser.

7. The integrated semiconductor optical element according to claim 6, characterized in that the waveguide core layer having the multilayer structure is a multiple quantum well active layer.

8. The integrated semiconductor optical element according to claim 1, characterized by having:

two modulation waveguide arms where the i type upper clad layer portions and the second conductivity type upper clad layer portions are aligned so as to alternate;
1×2 couplers connected to the two ends of the two modulation waveguide arms;
an input waveguide connected to one of the 1×2 couplers;
an output waveguide connected to the other 1×2 coupler; and
electrodes individually provided to regions that correspond to the second conductivity type upper clad layer portions in the two modulation waveguide arms.

9. The integrated semiconductor optical element according to claim 8, characterized in that the waveguide regions provided with the first conductivity type lower clad layer, the waveguide core layer and the i type upper clad layer portion are bent in arc form.

10. The integrated semiconductor optical element according to claim 9, characterized in that the waveguide regions provided with the first conductivity type lower clad layer, the waveguide core layer and the second conductivity type upper clad layer portion are bent in arc form in the opposite direction to the direction in which the waveguide regions provided with the first conductivity type lower clad layer, the waveguide core layer and the i type upper clad layer portion are bent.

11. The integrated semiconductor optical element according to claim 1, characterized by having a second conductivity type contact layer on the second conductivity type upper clad layer portions.

* * * * *